United States Patent
Karino

(10) Patent No.: US 11,408,925 B2
(45) Date of Patent: Aug. 9, 2022

(54) SEMICONDUCTOR ELEMENT AND METHOD FOR IDENTIFYING SEMICONDUCTOR ELEMENT

(71) Applicant: FUJI ELECTRIC CO., LTD., Kawasaki (JP)

(72) Inventor: Taichi Karino, Matsumoto (JP)

(73) Assignee: FUJI ELECTRIC CO., LTD., Kawaskai (JP)

( * ) Notice: Subject to any disclaimer, the term of this patent is extended or adjusted under 35 U.S.C. 154(b) by 402 days.

(21) Appl. No.: 16/660,205

(22) Filed: Oct. 22, 2019

(65) Prior Publication Data
US 2020/0191857 A1    Jun. 18, 2020

(30) Foreign Application Priority Data
Dec. 17, 2018  (JP) .............................. JP2018-235395

(51) Int. Cl.
*G01R 31/26*  (2020.01)
*H01L 49/02*  (2006.01)
(Continued)

(52) U.S. Cl.
CPC .......... *G01R 31/2601* (2013.01); *H01L 24/03* (2013.01); *H01L 24/05* (2013.01); *H01L 24/06* (2013.01); *H01L 24/78* (2013.01); *H01L 28/20* (2013.01); *H01L 28/24* (2013.01); *H01L 23/585* (2013.01); *H01L 2224/0391* (2013.01); *H01L 2224/03614* (2013.01); *H01L 2224/04042* (2013.01); *H01L 2224/05582* (2013.01);
(Continued)

(58) Field of Classification Search
CPC ..... G01R 31/2601; H01L 24/03; H01L 24/05; H01L 24/06; H01L 24/78; H01L 28/20; H01L 28/24; H01L 23/585; H01L 2224/03614; H01L 2224/0391; H01L 2224/04042; H01L 22/12; H01L 22/20; H01L 2224/0605; H01L 2224/0612; G01B 11/02
See application file for complete search history.

(56) References Cited

U.S. PATENT DOCUMENTS 6,851,100 B1    2/2005  You et al.
8,860,294 B2 *  10/2014  Toyota .................. H01L 33/382
                                                                313/498

(Continued)

FOREIGN PATENT DOCUMENTS

JP    8-306861 A    11/1996
JP    2003-282603 A    10/2003

*Primary Examiner* — Alvaro E Fortich
*Assistant Examiner* — Zannatul Ferdous

(57) ABSTRACT

A semiconductor element encompasses a first external electrode on an upper surface side of a semiconductor chip, a second external electrode, spaced apart from the first external electrode, provided in parallel with the first external electrode; and a protective film covering the first and second external electrodes, having first and second windows to expose portions of upper surfaces of the first and second external electrodes, respectively. Planar patterns of the first and second windows are in two-fold rotational symmetry with respect to a center point of an area including the first and second external electrodes and to be asymmetric with respect to a center line between the first and second external electrodes.

11 Claims, 8 Drawing Sheets

(51) Int. Cl.
_H01L 23/00_ (2006.01)
_H01L 23/58_ (2006.01)

(52) U.S. Cl.
CPC .............. _H01L 2224/05624_ (2013.01); _H01L 2224/05644_ (2013.01); _H01L 2224/05647_ (2013.01); _H01L 2224/05655_ (2013.01); _H01L 2224/05666_ (2013.01); _H01L 2224/06181_ (2013.01); _H01L 2224/789_ (2013.01)

(56) References Cited

U.S. PATENT DOCUMENTS

| | | | |
|---|---|---|---|
| 9,201,203 B2 * | 12/2015 | Yamamoto | G02B 6/4283 |
| 9,437,460 B2 * | 9/2016 | Yoshimatsu | H01L 21/4853 |
| 9,484,556 B2 * | 11/2016 | Lhee | H01L 27/3276 |
| 10,481,008 B2 * | 11/2019 | Saitou | H01L 35/34 |
| 11,164,953 B2 * | 11/2021 | Hirabayashi | H01L 29/872 |
| 2010/0045917 A1 * | 2/2010 | Imai | G02F 1/133707 |
| | | | 349/139 |

* cited by examiner

SEMICONDUCTOR ELEMENT AND METHOD FOR IDENTIFYING SEMICONDUCTOR ELEMENT

CROSS REFERENCE TO RELATED APPLICATIONS

This application is based upon and claims the benefit of priority from the prior Japanese Patent Application No. P2018-235395 filed on Dec. 17, 2018, the entire contents of which are incorporated herein by reference.

BACKGROUND OF THE INVENTION

1. Field of the Invention

The present invention relates to a semiconductor element and a method for identifying a semiconductor element that can easily identify a difference in characteristics.

2. Description of the Related Art

As to technical fields pertaining to semiconductor integrated circuits (ICs) and the like, JP H8-306861A discloses a semiconductor element having a resistive layer made of a polycrystalline silicon (polysilicon) thin film. In the semiconductor element described in JP H8-306861A, two electrodes are connected to both ends of the resistive layer on an upper surface of the resistive layer, and bonding wires are bonded to the two electrodes, respectively. Thus, a chip size is increase and the two bonding wires are required.

Therefore, a vertical semiconductor element, in which an end of the resistive layer is connected to an electrode on the upper-surface side of the resistive layer, and the other end of the resistive layer is ohmically connected to the semiconductor substrate through an intermediate connecter, may be adopted. By using a vertical structure of semiconductor elements, it is possible to reduce the chip size more than a planar semiconductor element, and to reduce a number of bonding wires connected to the electrodes.

In order to prevent an increase in resistance value when the semiconductor element is operated at high temperature, a negative temperature coefficient of 0 ppm/° C. or less is preferable. The resistive layer of the semiconductor element is established by doping of impurity atoms into a polysilicon layer. In the case of ion implantation, the temperature coefficient of the semiconductor element can be controlled by adjusting a dose amount and acceleration voltage of the impurity ions to be implanted into the polysilicon layer, and temperature and time of activation annealing of the implanted impurity ions. The resistance value of the semiconductor element is controlled by adjusting a length and width of the resistive layer, assuming a thickness of the resistive layer is constant.

In mounting a semiconductor element, a bonding wire is bonded to a pad, which is exposed in a window part of the upper surface of the resistive layer. JP 2003-282603A proposes to reduce human error in an assembly production process by providing design rules pertaining to a chip size, a bonding-pad size and the like.

However, a plurality of semiconductor elements having different resistance values may be manufactured in the same process with the same chip size or the same pad size. The semiconductor elements having different resistance values are respectively stored in a tray or the like and mounted in the same assembly production process. As described above, since the resistance value is adjusted by the length and width of the pattern on a plane of the resistive layer, it is difficult to identify even if other semiconductor chips are mixed. There is also a possibility of being mistaken for other semiconductor chips. Therefore, in the assembly production process, it is difficult to confirm whether the semiconductor element is a desired semiconductor element, and thus, an error may occur.

SUMMARY OF THE INVENTION

An aspect of the present invention inheres in a semiconductor element, including: (a) a first external electrode on an upper surface side of a semiconductor chip; (b) a second external electrode, spaced apart from the first external electrode, provided in parallel with the first external electrode; and (c) a protective film covering the first and second external electrodes, having first and second windows to expose portions of upper surfaces of the first and second external electrodes, respectively, wherein planar patterns of the first and second windows are in two-fold rotational symmetry with respect to a center point of an area including the first and second external electrodes and to be asymmetric with respect to a center line between the first and second external electrodes.

Another aspect of the present invention inheres in a method for identifying a semiconductor element, including (a) registering data of a distance between a first reference intersection and a second reference intersection as a reference diagonal length by capturing a planar image of a reference-element, the reference-element including: a first reference external electrode on an upper surface of a reference chip; a second reference external electrode having a similar shape with the first reference external electrode, spaced apart from the first reference external electrode and provided in parallel to the first reference external electrode on the upper surface of the reference chip; and a reference protective film having first and second reference windows, which cover the upper surface of the reference chip, each having a rectangular shape, the first and second reference windows expose parts of the first and second reference external electrodes, respectively, the first and second reference windows are in symmetry with respect to a center line between the first and second reference external electrodes, wherein in planar patterns of the first and second reference windows, the first and second reference intersections are located opposite sides of the first and second windows facing each other, and in two-fold rotational symmetry with respect to a center point of an area including the first and second reference external electrodes; (b) registering data of a distance between first and second intersection points as a target diagonal length by capturing a planar image of a target semiconductor element, the target semiconductor element including: a first external electrode on an upper surface of a target chip; a second external electrode having a similar shape with the first external electrode, spaced apart from the first external electrode and provided in parallel to the first external electrode on the upper surface of the target chip; and a protective film having first and second windows, which cover the upper surface of the target chip, each having a rectangular shape, the first and second windows expose parts of the first and second external electrodes, respectively, wherein in planar patterns of the first and second windows, the first and second windows are in point-symmetry with respect to a center point of an area including the first and second external electrodes and asymmetric with respect to a center line between the first and second reference external electrodes, and each of the first and second intersection points is defined at a position where each long side located an opposite side of the first and second windows facing each other, crosses each short side; and (c) identifying the target chip as an appropriate product when a diagonal length difference between the reference diagonal length and the target diagonal length is equal to or greater than a specified value.

DETAILED DESCRIPTION

Figure 1:
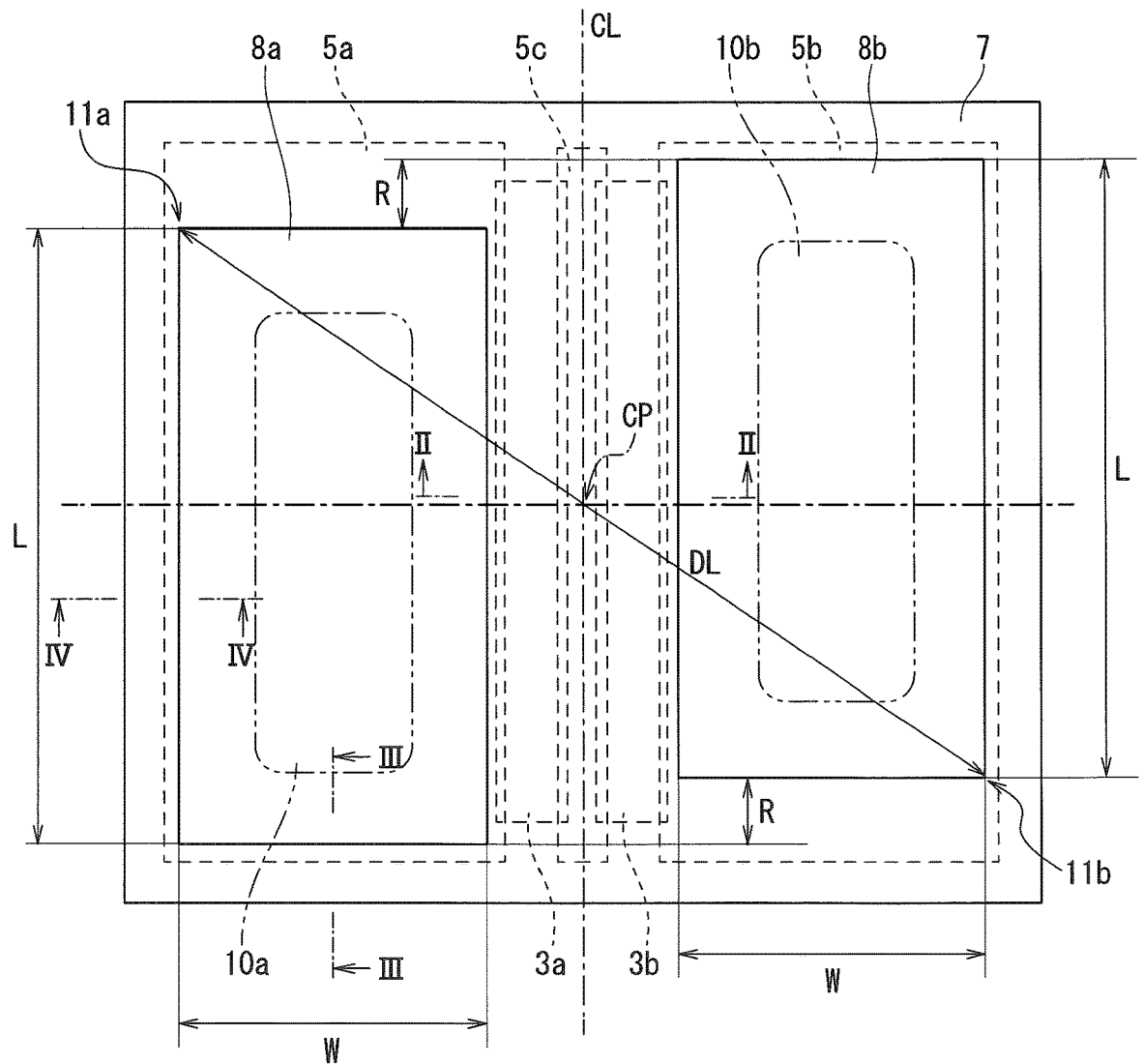
FIG. 1 is a schematic plan view illustrating an example of a semiconductor element according to an embodiment of the present invention.

Hereinafter, embodiments of the present invention will be described with reference to the drawings. In the descriptions of the drawings, the same or similar parts are denoted by the same or similar reference numerals, and duplicate explanation is omitted. However, the drawings are schematic, the relationship between the thickness and the plane dimension, the ratio of the thickness of each layer, etc. may be different from the actual one. In addition, parts having different dimensional relations and ratios may also be included between drawings. In addition, the embodiments described below exemplify apparatuses and methods for embodying the technical idea of the present invention, and the technical idea of the invention does not specify the material, shape, structure, or arrangement of the elements described below.

In the following descriptions, the terms relating to directions, such as "left and right" and "top and bottom" are merely defined for illustration purposes, and thus, such definitions do not limit the technical spirit of the present invention. Therefore, for example, when the paper plane is rotated by 90 degrees, the "left and right" and the "top and bottom" are read in exchange. When the paper plane is rotated by 180 degrees, the "top" is changed to the "bottom", and the "bottom" is changed to the "top".

(Semiconductor Element)

As illustrated in FIG. 1, as an example of a semiconductor element according to an embodiment of the present invention, a resistor element having a rectangular planar pattern such that a direction in which a pair of first and second external electrodes $5a$, $5b$ and an intermediate connecter $5c$ are aligned to a longer side direction will be explained. As a planar pattern, the intermediate connecter $5c$ is arranged between the first external electrode $5a$ and the second external electrode $5b$. A chip size of the semiconductor element according to the embodiment is, for example, about 2.8 millimeters by about 2.5 millimeters. As illustrated in FIG. 1, the first external electrode $5a$ disposed on the left side and the second external electrode $5b$ disposed on the right side have substantially similar shapes to each other. The first external electrode $5a$ and the second external electrode $5b$ are spaced apart and arranged in parallel. For example, each of the first external electrode $5a$ and the second external electrode $5b$ has a rectangular planar pattern such that a vertical direction in FIG. 1 is assigned to a longer side direction. And, each of the first external electrode $5a$ and the second external electrode $5b$ has a length of about 2.1 millimeters and a width of about 1.0 millimeter and an interval between the first external electrode $5a$ and the second external electrode $5b$ is about 0.5 millimeter or more. As illustrated in FIG. 1, each of a first resistive layer $3a$, a second resistive layer $3b$, and the intermediate connecter $5c$ also has a rectangular planar pattern such that the vertical direction of FIG. 1 is assigned to the longer side direction.

Figure 2:
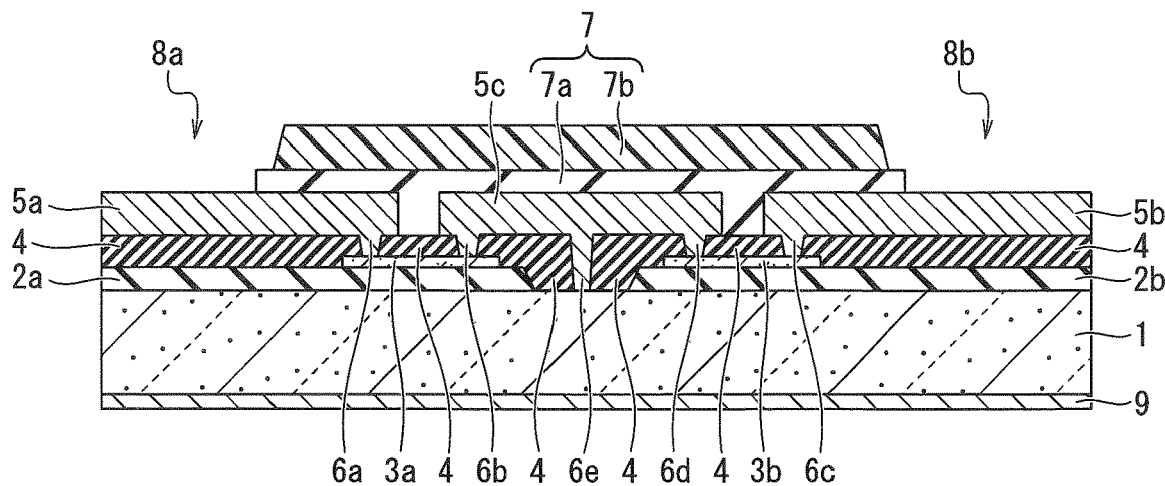
FIG. 2 is a schematic view illustrating an enlarged cross section taken along the line II-II, which is a part of the semiconductor element of FIG. 1.

As can be seen from a partially enlarged cross-sectional view focusing on an area of the intermediate connecter $5c$ in FIG. 2, a protective film 7, or a passivation film, is formed on the pair of the first external electrode $5a$ and the second external electrode $5b$, and the intermediate connecter $5c$. A first window $8a$ is provided in the protective film 7 so as to expose a part of an upper surface of the first external electrode $5a$. And a second window $8b$ is provided in the protective film 7 so as to expose a part of an upper surface of the second external electrode $5b$. As illustrated in FIG. 1, the first window $8a$ and the second window $8b$ are rectangular planar patterns each having a length L and a width W. For example, each length L of the first window $8a$ and the second window $8b$ is about 1.9 millimeters, and each width W of the first window $8a$ and the second window $8b$ is about 0.9 millimeter. A portion of the first external electrode $5a$ exposed from the first window $8a$ is assigned to an effective connection area $10a$ to which an external-connection member, such as a bonding wire, a bonding ribbon and the like, may be scheduled to be bonded. Similarly, a portion of the second external electrode $5b$ exposed from the first window $8b$ is assigned to an effective connection area $10b$ to which an external-connection member, such as a bonding wire, a bonding ribbon and the like, may be scheduled to be bonded. For example, the area of the effective connection areas $10a$ and $10b$ are about 1.3 millimeters multiplied by about 0.74 millimeter or less, respectively.

The rectangular planar pattern of the intermediate connecter $5c$ is provided on the center line CL passing through the center point CP of the semiconductor chip. A planar pattern including the first resistive layer $3a$, the second resistive layer $3b$, the first external electrode $5a$, the second external electrode $5b$, and the intermediate connecter $5c$ is provided in line-symmetry with respect to the center line CL passing through the center point CP of the semiconductor chip. That is, the planar patterns of the first resistive layer 3a, the second resistive layer 3b, the first external electrode 5a, the second external electrode 5b, and the intermediate connecter 5c are in two-fold rotational symmetry with respect to the center point CP of the semiconductor chip. By having rotational symmetry, the semiconductor device according to the embodiment may be rotated by 180 degrees at a timing of mounting the semiconductor on a stage for assembly work, and the degree of freedom of arrangement during assembly work may be increased.

As illustrated in FIG. 1, the first window 8a and the second window 8b are asymmetric with respect to the center line CL passing through the center point CP of the semiconductor chip in the planar pattern, and are arranged in two-fold rotational symmetry with respect to the center point CP of the semiconductor chip. That is, as illustrated in FIG. 1, an upper boundary of the first window 8a arranged on the left side of FIG. 1 is shifted downward by a decremented length R from an upper boundary of the second window 8b arranged on the right side of FIG. 1. Further, a lower boundary of the first window 8a is shifted downward by a decremented length R from a lower boundary of the second window 8b. In the first window 8a, an upper vertex of the first window 8a located in the opposite side to the second window 8b which faces the first window 8a, is defined as a "first intersection point 11a". In the second window 8b, a lower vertex of the second window 8b located in the opposite side of the first window 8a which faces the first window 8b, is defined as a "second intersection point 11b". A length between the first intersection point 11a and the second intersection point 11b is defined as a diagonal length DL. For example, the diagonal length DL of the semiconductor element according to the embodiment may be selected to be about 2.96 millimeters.

Figure 3:
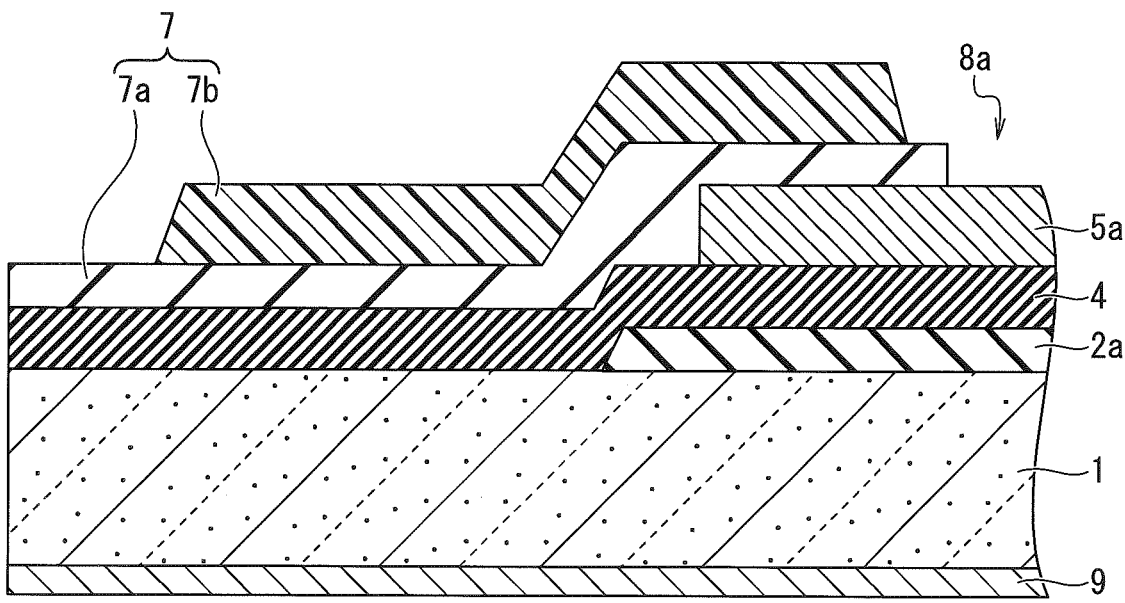
FIG. 3 is a schematic cross-sectional view of the semiconductor element taken along the line III-III of FIG. 1.
Figure 4:
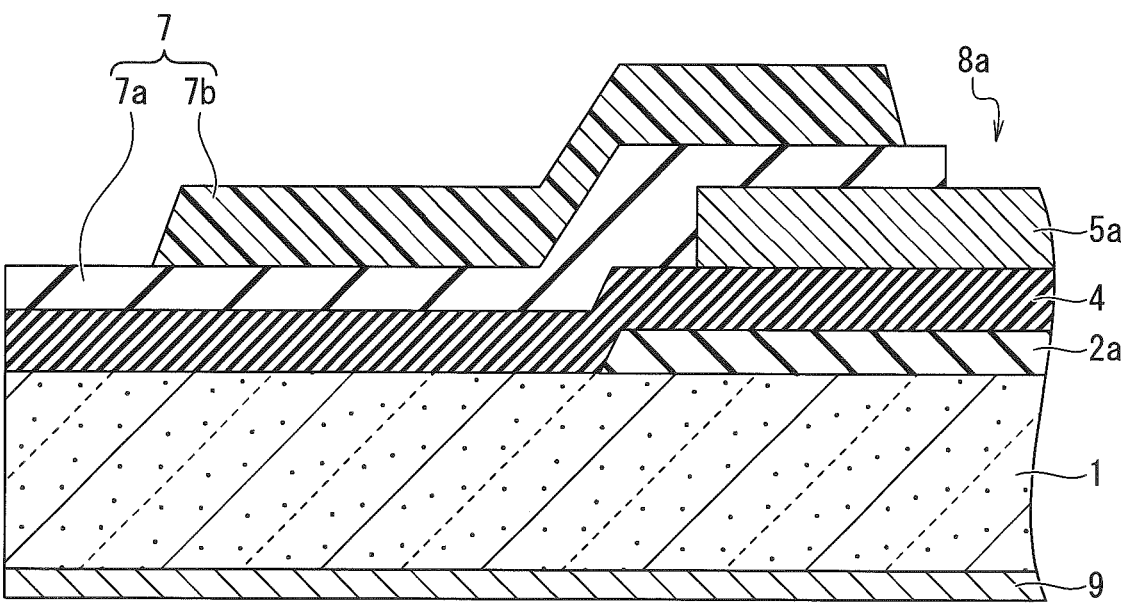
FIG. 4 is a schematic cross-sectional view of the semiconductor element taken along the line IV-IV of FIG. 1.

As illustrated in FIGS. 2 to 4, an example of the semiconductor device according to the embodiment includes a first conductivity type (n-type) semiconductor substrate 1, an underlying-insulating film (2a, 2b), a first resistive layer 3a, and a second resistive layer 3b. The underlying-insulating film (2a, 2b) is disposed on the semiconductor substrate 1. Thin films of the first resistive layer 3a and the second resistive layer 3b are disposed on the underlying-insulating film (2a, 2b). The semiconductor element according to the embodiment, may be used for a resistor element, where for example, an insulated gate semiconductor element, such as an insulated gate bipolar transistor (IGBT), a MIS transistor and the like, may be used as a main semiconductor element, and the resistor element may be applied as a gate resistance of the main semiconductor element. Therefore, when used as the resistor element, such as a gate resistance and the like, a thickness of the semiconductor substrate 1 is, for example, about 250 micrometers to about 450 micrometers, and a resistivity of the semiconductor substrate 1 is usually selected to be a relatively low value. As the semiconductor substrate 1, for example, a silicon (Si) substrate or the like can be used.

Hereinafter, the description will be focused on the case where the semiconductor element according to the embodiment is used as a resistor element, but the present invention is not limited to the resistance element, and topological features of the present invention can be applied to miscellaneous semiconductor elements having the similar features of the disclosed resistor element. In the cross-sectional views of FIG. 2 to FIG. 4, different reference numerals are assigned as the underlying-insulating film (2a, 2b). However, the underlying-insulating film (2a, 2b) may be a single member that is continuous in a back side of the page.

Although not illustrated, the n$^+$-type contact region having a lower resistivity than the semiconductor substrate 1 is provided between the underlying-insulating films 2a, 2b. Note that a second conductive type (p$^-$-type) semiconductor substrate 1 may be used, and p$^+$-type semiconductor region having a lower resistivity than the semiconductor substrate 1 may be buried in the semiconductor substrate 1 as a contact region.

As the underlying-insulating film (2a, 2b), for example, a field insulating film having a thickness of about 600 nanometers to about 1000 nanometers may be used. For the underlying-insulating film (2a, 2b), a silicon oxide ($SiO_2$) film, a silicon nitride ($Si_3N_4$) film, or a composite film of the $SiO_2$ film and the $Si_3N_4$ film may be used. The underlying-insulating film (2a, 2b) may be an insulating film deposited by a chemical vapor deposition (CVD) method using an organosilicon compound gas, such as tetraethoxysilane (TEOS) and the like. The parasitic capacitance can be reduced by increasing the thickness of the underlying-insulating film (2a, 2b).

Each thickness of the first resistive layer 3a and the second resistive layer 3b is, for example, about 400 nanometers to about 600 nanometers, and each sheet resistance of the first resistive layer 3a and the second resistive layer 3b is, for example, about 100 ohms per square to about 200 ohms per square. Each resistance value of the first resistive layer 3a and the second resistive layer 3b may be controlled by adjusting each thickness of the first resistive layer 3a and the second resistive layer 3b, each width of the first resistive layer 3a and the second resistive layer 3b in the vertical direction of FIG. 1, a length Lr of the first resistive layer 3a and the second resistive layer 3b in the left and right direction of FIG. 1, and a material of the first resistive layer 3a and the second resistive layer 3b. For each material of the first resistive layer 3a and the second resistive layer 3b, for example, polycrystalline silicon doped with an n-type impurity, that is, doped polysilicon (DOPOS) film can be used. The n-type DOPOS film may be heavily doped by impurity atoms, such as phosphorus (P) atoms, boron (B) atoms and the like, by schemes of ion implantation into to a polysilicon film or depositing the polysilicon film by CVD method, while doping the impurity atoms from the gas phase using doping gas. It is possible to control each resistance value of the first resistive layer 3a and the second resistive layer 3b by adjusting the doping amount of the impurity atoms into the DOPOS film to change the resistivity of DOPOS film.

Preferably, each temperature coefficient of the first resistive layer 3a and the second resistive layer 3b is 0 ppm per degree Celsius or less, that is, each temperature coefficient of the first resistive layer 3a and the second resistive layer 3b is 0, or each of the first resistive layer 3a and the second resistive layer 3b has a negative temperature coefficient. By selecting the temperature coefficient, it is possible to prevent an increase in the resistance value at high temperature operation. For example, when the resistor element according to the embodiment is applied to the gate resistance of the IGBT, it is possible to prevent a loss when the IGBT is on-state. The temperature coefficient of DOPOS film can be controlled by adjusting the dose amount when implanting the impurity ions into the polysilicon. For example, when the dose amount is about $7.0 \times 10^{15}$ per centimeter square or less, the temperature coefficient of DOPOS film may be 0 ppm per degree Celsius or less. The temperature coefficients of the first resistive layer 3a and the second resistive layer 3b are not necessarily limited to 0 ppm per degree Celsius or less, and the first resistive layer 3a and the second resistive layer 3b may have a positive temperature coefficient.

The first resistive layer 3a and the second resistive layer 3b are not limited to the DOPOS film, and a transition-metal-nitride film, such as tantalum nitride ($TaN_x$), or a multi-layer film of refractory metals of sequentially laminated chromium (Cr)-nickel (Ni)-manganese (Mn), may be used. Alternatively, for each of the first resistive layer 3a and the second resistive layer 3b, a thin film, such as a silver palladium (AgPd) film, a ruthenium oxide ($RuO_2$) or the like, may be used. Although different from the structure illustrated in FIGS. 2 to 4, it is also possible to achieve each of the first resistive layer 3a and the second resistive layer 3b by a p-type impurity-diffused layer or an n-type impurity-diffused layer buried at a surface of the semiconductor layer.

An interlayer insulating film 4 is arranged to cover the underlying-insulating film s 2a, 2b and the first and second resistive layers 3a, 3b. A thickness of the interlayer insulating film 4 is, for example, about 1000 nanometers to about 2000 nanometers. For the interlayer insulating film 4, a silicon oxide ($SiO_2$) film containing no impurity, called a "NSG film", a silicon oxide film in which phosphorus atoms are doped, that is, a phosphor-silicate glass (PSG) film, a silicon oxide film in which boron atoms are doped, that is, a boro-silicate glass (BSG) film and the like may be used. Furthermore, a single layer film of a silicon oxide film in which phosphorus and boron atoms are doped, that is, a boro-phospho-silicate glass (BPSG) film or a silicon nitride film ($Si_3N_4$ film), or a composite film in which two or more of the above-mentioned films are selected and combined, may be also adopted as the interlayer insulating film 4. For example, the interlayer insulating film 4 may be made of a composite film in which the NSG film of about 500 nanometers to about 800 nanometers and the PSG film of about 400 nanometers to about 800 nanometers are laminated. The NSG film has a function of decreasing the resistance variation. In addition, the PSG film has a function of securing the strength of wire bonding.

As illustrated in the partially enlarged cross-sectional view of FIG. 2, on the interlayer insulating film 4, a pair of the first external electrode 5a and the second external electrode 5b, and the intermediate connecter 5c are disposed. The first external electrode 5a is located above the underlying-insulating film 2a, and a horizontal position of an end of the first external electrode 5a overlaps with one end of the first resistive layer 3a in the depth direction. The second external electrode 5b is located above the underlying-insulating film 2b and a horizontal position of an end of the second external electrode 5b overlaps with one end of the second resistive layer 3b in the depth direction. The intermediate connecter 5c is arranged so that the cross-sectional structure illustrated in FIG. 2 is approximately T-shaped, the T-shape inter-connects from a position above the underlying-insulating film 2a to a position above the underlying-insulating film 2b, and is sandwiched in between the first external electrode 5a and the second external electrode 5b.

The first external electrode 5a is electrically connected to an end (left-side end in FIG. 2) of the first resistive layer 3a via the contact region 6a. Another end (right-side end in FIG. 2) of the first resistive layer 3a is electrically connected to one intermediate connection-terminal, which is a left-side of the intermediate connecter 5c, via the contact region 6b. The second external electrode 5b is electrically connected to a right-side end of the second resistive layer 3b via the contact region 6c. A left-side end of the second resistive layer 3b is electrically connected to the other intermediate connection-terminal, which is the right-side end of the intermediate connecter 5c, via the contact region 6d. The substrate-connection terminal, which is the central portion of the T-shaped intermediate connecter 5c, is ohmically connected to the $n^+$-type contact region (not shown) buried at the top of the semiconductor substrate 1, via the contact region 6e with low contact resistance. A counter electrode 9 is provided on a bottom surface of the semiconductor substrate 1. That is, the first resistive layer 3a and the second resistive layer 3b are electrically connected in series to the semiconductor substrate 1 via the intermediate connecter 5c, respectively, and a vertical structure of the resistor element, which has resistor components between the first external electrode 5a and the counter electrode 9, and between the second external electrode 5b and the counter electrode 9, is achieved.

Thicknesses of the pair of the first external electrode 5a and the second external electrode 5b, and the intermediate connecter 5c are, for example, about three micrometers. Each of the first external electrode 5a, the second external electrode 5b and the intermediate connecter 5c is formed from a laminated film of, for example, titanium/titanium nitride (Ti/TiN) film as a barrier metal of about 100 nanometers to about 130 nanometers, aluminum-silicon (Al—Si) film of about three micrometers, and TiN/Ti film as an antireflection film of about 35 nanometers to about 55 nanometers. Instead of Al—Si, Al or an Al alloy, such as Al—Cu—Si, Al—Cu and the like, may be used. Each of the first external electrode 5a and the second external electrode 5b may implement an electrode pad for an output connection or assembly work. An external connection wiring, such as a bonding wire made of Al wire and the like, having a diameter of about 200 micrometers to about 400 micrometers, is connected to the first external electrode 5a and the second external electrode 5b.

Although not shown, a guard-ring layer may be disposed on the interlayer insulating film 4. The guard-ring layer is made of the same material as the first external electrode 5a, the second external electrode 5b and the intermediate connecter 5c. The guard-ring layer is, for example, is delineated into a ring shape on the outer peripheral portion of the semiconductor chip, which implements the resistor element according to the embodiment. The guard-ring layer is ohmically connected to the semiconductor substrate 1 via a contact region.

As illustrated in FIGS. 2 to 4, a protective film 7, or a passivation film, is laminated on the first external electrode 5a, the second external electrode 5b, and the intermediate connecter 5c. The protective film 7 may be formed of, for example, a composite film in which a first protective film 7a, such as a TEOS film, a $Si_3N_4$ film and the like, and a second protective film 7b, such as a polyimide film and the like, are laminated. A first window 8a and a second window 8b are provided in the protective film 7. For example, the first protective film 7a may be a deposited $Si_3N_4$ film by plasma CVD method or the like. Thereafter, as the second protective film 7b, a polyimide film may be coated on the $Si_3N_4$ film. In a case when the polyimide film is coated on the $Si_3N_4$ film as the second protective film 7b, subsequently, the polyimide film is selectively removed by a photolithography technique, a wet etching technique, or the like to form windows in which surfaces of the $Si_3N_4$ film are exposed. Next, in the windows of the polyimide film, by a photolithography technique, a dry etching technique and the like, additional windows in which surfaces of the first external electrode 5a and the second external electrode 5b is exposed, are formed by selectively removing the $Si_3N_4$ film in the windows of the polyimide film. As a result, as illustrated in FIG. 2 to FIG. 4, the first window 8a and the second window 8b are cut. As illustrated in FIG. 3 and FIG. 4, the second protective film 7b made of the polyimide film is retracted toward outer side of the first window 8a along a horizontal direction, and relatively, the first protective film 7a made of the $Si_3N_4$ film is protruded toward inner side along the horizontal direction at end of the first window 8a. As can be seen in FIG. 2, similarly, the second protective film 7b is retracted toward outer side of the second window 8b, and relatively, the first protective film 7a is protruded at end of the second window 8b. A portion of the first external electrode 5a exposed from the first window 8a serves as a mounting pad area to which a bonding wire may be connected. Similarly, a portion of the second external electrode 5b exposed from the second window 8b serves as a mounting pad area to which a bonding wire may be connected.

As illustrated in FIGS. 2 to 4, the counter electrode 9 is disposed on the bottom surface of the semiconductor substrate 1. The counter electrode 9 may be formed from, for example, a single layer film made of gold (Au) or a metal film laminated in the order of titanium (Ti), nickel (Ni), and gold (Au). The outermost layer of the counter electrode 9 may be made of a solderable material. The counter electrode 9 is fixed to a metal plate or the like by soldering or the like.

In the case where the semiconductor element according to the embodiment is the resistor element, as illustrated in FIG. 2, the semiconductor element is based on a vertical structure with the T-shaped intermediate connecter 5c, in which both ends of the T-shaped intermediate connecter 5c are electrically connected to the first resistive layer 3a and the second resistive layer 3b as the intermediate connection-terminals. A substrate-connection terminal, which is a terminal on a center side of the T-shaped intermediate connecter 5c, is ohmically connected to an $n^+$-type contact region (not shown) buried at the top surface of the semiconductor substrate 1 with a low contact resistance, so that a vertical structure of a semiconductor element can be established. Thus, one of the mounting-connection regions, or one of the pad areas, implemented by the first external electrode 5a electrically connected to the first resistive layer 3a can be assigned to the first resistive layer 3a. And, one of the mounting-connection regions, or one of the pad areas, implemented by the second external electrode 5b electrically connected to the second resistive layer 3b can be assigned to the second resistive layer 3b. Therefore, in the semiconductor element of the embodiment, a number of bonding wires per each one of the first resistive layer 3a and the second resistive layer 3b may be one, and the number of bonding wires can be decreased as compared with a planar semiconductor element. Further, since an area occupied by the external-connection area, or the pad area, for mounting on the upper surface side can be reduced as compared with the planar semiconductor element, a chip size can be reduced.

Figure 5:
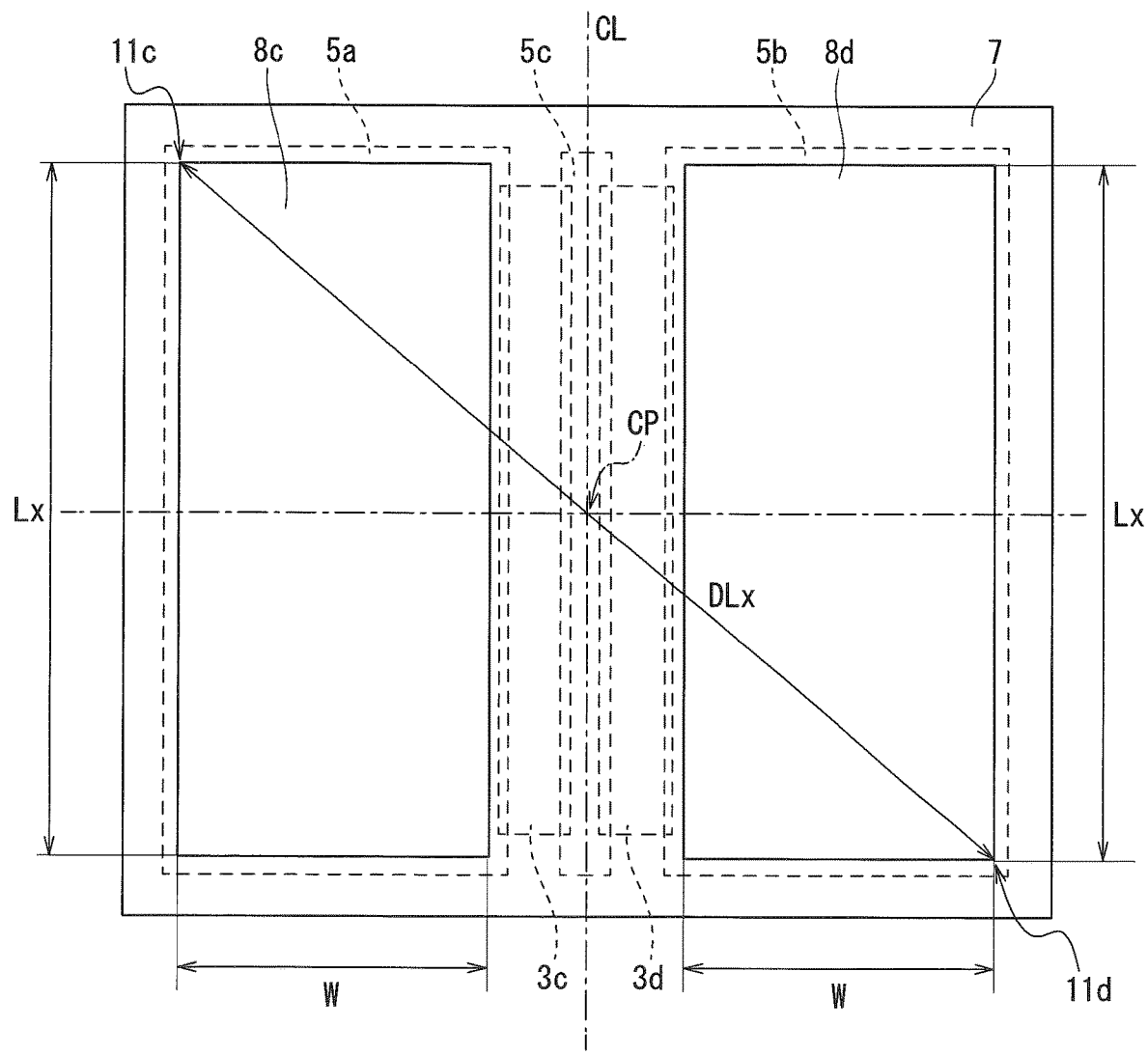
FIG. 5 is a plan view illustrating an example of an earlier semiconductor element used to explain the embodiment of the present invention.

FIG. 5 illustrates a planar pattern of a general and earlier semiconductor element. A length and a width of each of a first resistive layer 3c and a second resistive layer 3d of the general semiconductor element are set to be different from the length and the width of each of the first resistive layer 3a and the second resistive layer 3b so that the resistance values are different. As illustrated in FIG. 5, a rectangular pattern of the protective film 7 is provided with a pair of first window 8c and second window 8d that partially expose the first external electrode 5a and the second external electrode 5b. The first window 8c and the second window 8d have similar shapes, each being in a rectangular planar pattern having a length Lx and a width W. The first window portion 8c and the second window portion 8d are arranged, in a planar pattern, so as to be in line symmetry with respect to the center line CL passing through the center point CP and in two-fold rotational symmetry with respect to the semiconductor chip center point CP. In the first window 8c, an upper vertex in a corner portion of the first window 8c located in the opposite side to the second window 8d which faces the first window 8c, is defined as a first intersection point 11c. In the second window 8d, a lower vertex in a corner portion of the second window 8d located in the opposite side of the first window 8c which faces the second window 8d, is defined as a second intersection point 11d. A length between the first intersection point 11c and the second intersection point 11d is defined as a diagonal length DLx. For example, the lengths Lx and the widths W of the first window 8c and the second window 8d are about 2.0 millimeters and about 0.9 millimeter, respectively, and the diagonal length DLx is about 3.08 millimeters.

On the other hand, in the semiconductor device according to the embodiment shown in FIG. 1, the first window 8a and the second window 8b are arranged in two-fold rotational symmetry with respect to the center point CP of the semiconductor chip in the surface pattern. However, the first window 8a and the second window 8b are asymmetric with respect to the center line CL passing through the center point CP of the semiconductor chip. As described above, the semiconductor element of the embodiment has a different planar pattern from the earlier semiconductor element. Each of the first window 8a and the second window 8b of the semiconductor element of the embodiment has the length L, respectively, while each of the first window 8c and the second window 8d of the earlier semiconductor element has the length Lx, which is different from the length L. That is, the length L of each of the first window 8a and the second window 8b is shortened by the decremented length R from the length Lx of each of the first window 8c and the second window 8d.

For example, in the semiconductor element incorporated in a semiconductor device, such as a power module and the like, a resistance value varies depending on User-requirement Specification of the semiconductor device. In order to manufacture target semiconductor elements having different resistance values, widths and lengths of the resistive layers are adjusted with respect to an earlier reference-element. However, chip sizes, manufacturing processes, assembly production processes, etc. of the target semiconductor elements are the same as the reference-element. Since the target semiconductor element and the reference-element are manufactured using different wafers, the target semiconductor element and the reference-element are not mixed during the manufacturing processes. However, in the assembly production process, for example, if a tray for supplying semiconductor elements is wrong or management of the tray is poor, it is conceivable that the reference-elements are mixed into the target semiconductor elements as inappropriate products. Therefore, it is desired to detect the inappropriate products mixed in at the stage of the assembly production process.

Figure 6:
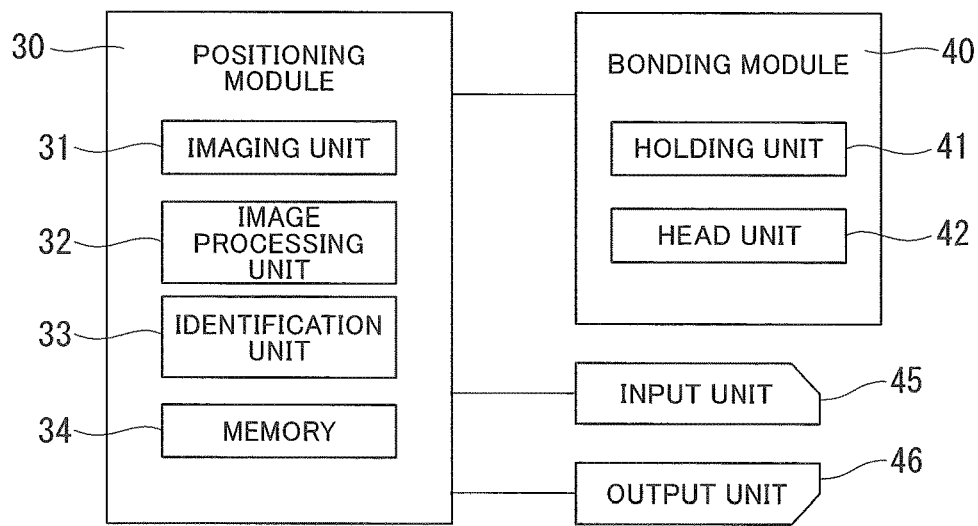
FIG. 6 is a schematic view of a bonding apparatus used to explain an example of an assembly production process of the semiconductor element according to the embodiment of the present invention.

For example, in the assembly production process, a wafer on which a large number of semiconductor elements are delineated in each chip areas is cut into a large number of semiconductor chips by dicing or the like. A circuit board, such as an insulating circuit board and the like, on which a chip of the semiconductor element is arranged is supplied to a bonding apparatus. As illustrated in FIG. 6, the bonding apparatus includes a bonding module 40, a positioning module 30, an input unit 45, and an output unit 46. The bonding module 40 includes a holding unit 41 which holds a semiconductor chip and a head unit 42 which executes wire bonding. The positioning module 30 includes an imaging unit 31 which takes a semiconductor chip image, an image processing unit 32 which executes image processing of the semiconductor chip image, an identification unit 33 which identifies the semiconductor chip, and a memory 34 which stores results of the image processing and the identification. The input unit 45 transmits information of input-operation to be executed by an operator toward the positioning module 30. The output unit 46 displays an image to be obtained, data to be processed and the like by the positioning module 30.

An imaging device used for the imaging unit 31 of the positioning module 30 has a low resolution and is not suitable for reliably recognizing a difference in a planar pattern by an image of about several hundred micrometers. However, the imaging device can recognize a difference in image contrast. In addition, by storing and registering data of reference-points, it is possible to capture the image having a diameter of about several hundred micrometers with regard to reference-points, and to measure a distance between the reference-points. Further, when the semiconductor element is bonded to a circuit board or the like using a joint member, the semiconductor element may be tilted due to uneven thickness of the joint member. Thus, when the semiconductor element is tilted, an error occurs in the measurement of the distance between the reference-points. Although it differs depending on the bonding apparatus, for example, when a difference in distance between the reference-points is 50 micrometers or more in two planar patterns, it is possible to recognize as a different planar pattern.

As described above, in the semiconductor chip of the semiconductor element, the first window 8a and the second window 8b, which serves as effective connection areas, are surrounded by the first protective film 7a made of the $Si_3N_4$ film. The imaging unit 31 can recognize the contrast difference between the surrounding $Si_3N_4$ film and the metal surfaces of the first window 8a and the second window 8b. In the embodiment, the image including the first intersection point 11a and the second intersection point 11b illustrated in FIG. 1 are captured, and the first intersection point 11a and the second intersection point 11b are registered as the data of reference-points. And the data of the distance between the first intersection point 11a and the second intersection point 11b is registered as the diagonal length DL. Further, the diagonal length DL of the semiconductor element of the embodiment is about 2.96 millimeters. The diagonal length DLx of the earlier semiconductor element is about 3.08 millimeters. The diagonal length difference between the semiconductor element of the embodiment and the earlier semiconductor element is about 120 micrometers and can be distinguished as the different semiconductor chips.

In the semiconductor element of the embodiment, the first window 8a and the second window 8b having similar shapes are arranged to be non-axisymmetric with respect to the center line CL of the semiconductor chip and to be in two-fold rotational symmetry with respect to the center point CP of the semiconductor chip. The first window 8a and the second window 8b are arranged to be misaligned each other in the long side direction. The diagonal length DL between the first intersection point 11a and the second intersection point 11b of the planar image pattern of the first window 8a and the second window 8b is changed depending on the resistance value of the semiconductor element. Therefore, it is easy to identify the difference in characteristics of the semiconductor elements. Further, in order to recognize three different planar patterns among the three planar patterns, it is necessary to set all the three distances between the reference-points of the two planar patterns selected from the three planar patterns to be larger than 50 micrometers.

Identification Method

An example of an identification method of the semiconductor element according to the embodiment will be given with reference to a flowchart illustrated in FIG. 7. In a factory assembly-line, an assembly production process of the earlier semiconductor element having the planar pattern illustrated in FIG. 5 has already been carried out using the bonding apparatus illustrated in FIG. 6. As a new semiconductor element having a resistance value different from the earlier semiconductor element, the semiconductor element of the embodiment having the planar pattern illustrated in FIG. 1 is introduced to the assembly production process.

Figure 7:
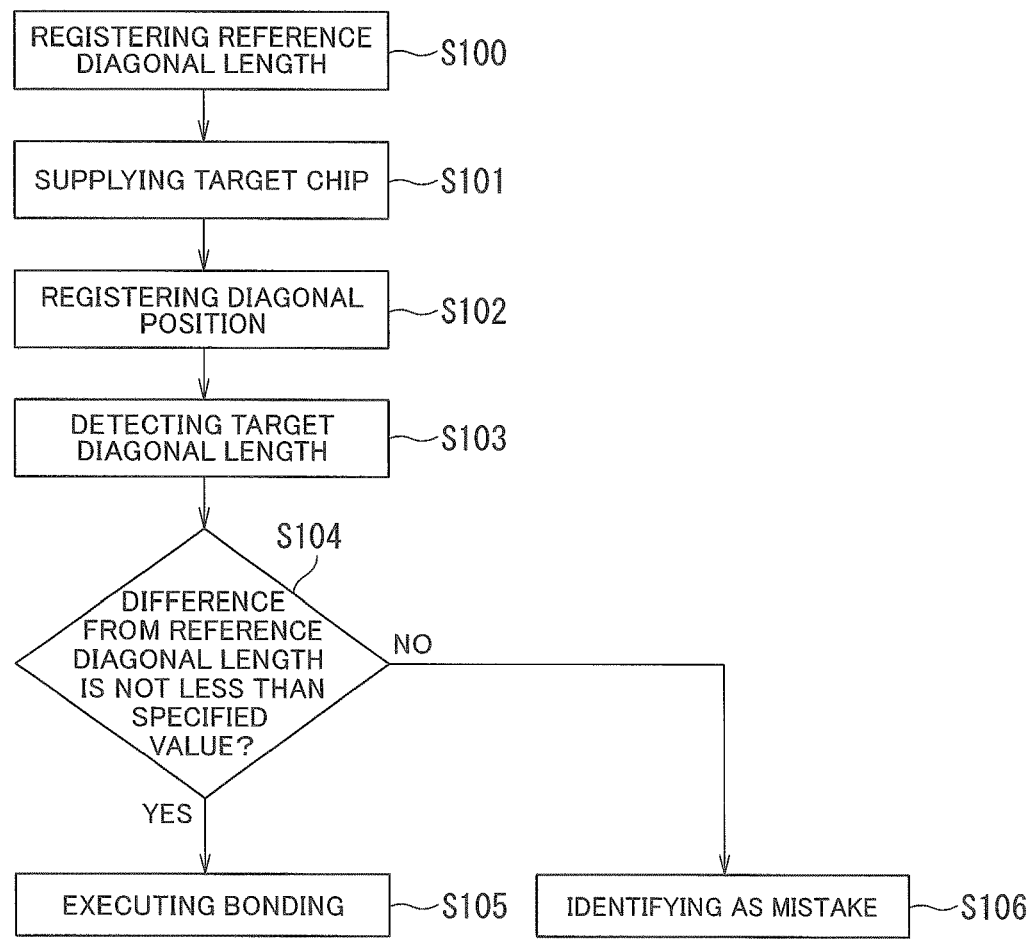
FIG. 7 is a flowchart illustrating an example of an identifying method of the semiconductor element according to the embodiment of the present invention.

In step S100 of FIG. 7, the semiconductor chip of the earlier semiconductor element is supplied to the bonding apparatus and placed on the holding unit 41 of the bonding module 40. Using an image captured by the imaging unit 31 of the positioning module 30, the image processing unit 32 allocates data of positions of the first intersection point 11c and the second intersection point 11d illustrated in FIG. 5 and registers the data of positions of the first intersection point 11c and the second intersection point 11d in the memory 34. A distance between the registered first intersection point 11c and the registered second intersection point 11d is detected and registered in the memory 34 as a reference diagonal length DLx.

In step S101, as a target chip, the semiconductor element of the embodiment is supplied to the bonding apparatus. In step S102, the target chip is placed on the holding unit 41 of the bonding module 40. Using an image captured by the imaging unit 31 of the positioning module 30, the image processing unit 32 allocates data of positions of the first intersection point 11a and the second intersection point 11b illustrated in FIG. 1 and registers the data of positions of the first intersection point 11a and the second intersection point 11b in the memory 34. In step S103, a distance between the registered first intersection point 11a and the registered second intersection point 11b is detected, and data of the distance is registered in the memory 34 as a target diagonal length DL.

In step S104, the identification unit 33 of the positioning module 30 calculates a diagonal length difference between the target diagonal length DL and the reference diagonal length DLx. When the diagonal length difference is greater than or equal to a specified value, in step S105, the target chip is identified as an appropriate product and bonding is executed. The specified value for the diagonal length difference is given as 50 micrometers. When the diagonal length difference is less than the specified value, in step S106, the target chip is identified as a false semiconductor chip that has been mixed by mistake.

In the identification method of the semiconductor element of the embodiment, the first intersection point 11a and the second intersection point 11b of the planar image pattern of the first window 8a and the second window 8b, which are bonding pads having a large contrast difference, are allocated. In addition, the first window 8a and the second window 8b having similar shapes are arranged to be non-axisymmetric with respect to the center line CL of the semiconductor chip and to be in two-fold rotational symmetry with respect to the center point CP of the semiconductor chip. The first window 8a and the second window 8b are arranged to be misaligned each other in the long side direction. Therefore, the diagonal length DL can be easily reduced as compared with the earlier semiconductor element, and the difference in characteristics can be easily identified.

Modification of Identification Method

In the above description, the case where one data of the resistance value in new semiconductor element is different from data of the resistance value in the earlier semiconductor element has been exemplified. However, there may be two or more data of the resistance value in new semiconductor elements are different from each other. When one data of the resistance value in new semiconductor element is distinguished from other data of the resistance values in new semiconductor element and the earlier semiconductor element, for example, when there are three types of semiconductor elements having different resistance values from each other, the one new semiconductor element is manufactured such that a diagonal length DL of the one new semiconductor element differs from diagonal lengths DL of other semiconductor devices by 50 micrometers or more. For example, the diagonal length DL of the one new semiconductor element is 100 micrometers different from the earlier semiconductor element, and the other diagonal length DL of the other new semiconductor element is 200 micrometers different from the earlier semiconductor element. Hereinafter, first and second modifications of the identification method will be given with reference to the flowcharts illustrated in FIGS. 8 and 9.

First Modification

First, an identification method of the semiconductor element according to a first modification of the embodiment, illustrated in FIG. 8, will be described. In step S200, each semiconductor chip of three types of semiconductor elements having different resistance values, that is, two new semiconductor elements and the earlier semiconductor element, are placed on the holding portion 41 of the bonding module 40 of FIG. 6. For each semiconductor chip of semiconductor elements having the different resistance values, a reference diagonal length DLx is detected by the image processing unit 32 using each image captured by the imaging unit 31 of the positioning module 30 as in step S100 of FIG. 7. The data of detected reference diagonal lengths DLx are registered in the memory 34.

Next, in step S201, among the three types of semiconductor elements having different resistance values, one semiconductor element to be identified, for example, the semiconductor element illustrated in FIG. 1 is assigned to a target chip and data of reference diagonal length of the target chip is registered. In step S202, the chip of the semiconductor element to be identified is supplied to the bonding apparatus illustrated in FIG. 6. In step S203, as in step S102 of FIG. 7, data of the positions of the first intersection point 11a and the second intersection point 11b illustrated in FIG. 1 are allocated and registered in the memory 34. In step S204, as in step S103 of FIG. 7, data of the distance between the registered first intersection point 11a and second intersection point 11b is detected and registered in the memory 34 as the target diagonal length DL.

In step S205, the identification unit 33 of the positioning module 30 calculates diagonal length differences between the target diagonal length DL and the respective reference diagonal lengths DLx other than the target semiconductor element. When all the calculated diagonal length differences are greater than or equal to the specified value, in step S206, the target chip is identified as an appropriate product and bonding is executed by the bonding apparatus. The specified value for the diagonal length difference is given as 50 micrometers. When even one diagonal length difference is less than the specified value, in step S207, the target chip is identified as a false semiconductor chip that has been mixed by mistake.

Second Modification

Next, an identification method of the semiconductor element according to a second modification of the embodiment, illustrated in FIG. 9, will be described. Since steps S210 to S214 illustrated in FIG. 9 are the same as steps S200 to S204 illustrated in FIG. 8, redundant description will be omitted.

In step S215, the identification unit 33 of the positioning module 30 calculates a diagonal length difference between the target diagonal length DL and the reference diagonal length DLx of the target semiconductor element. When the diagonal length difference is less than the specified value, in Step S216, the target chip is identified as an appropriate product and bonding is executed by the bonding apparatus of FIG. 6. The specified value for the diagonal length difference is given as 50 micrometers. When the diagonal length difference is equal to or greater than the specified value, in step S217, the target chip is identified as a false semiconductor chip that has been mixed by mistake.

Figure 8:
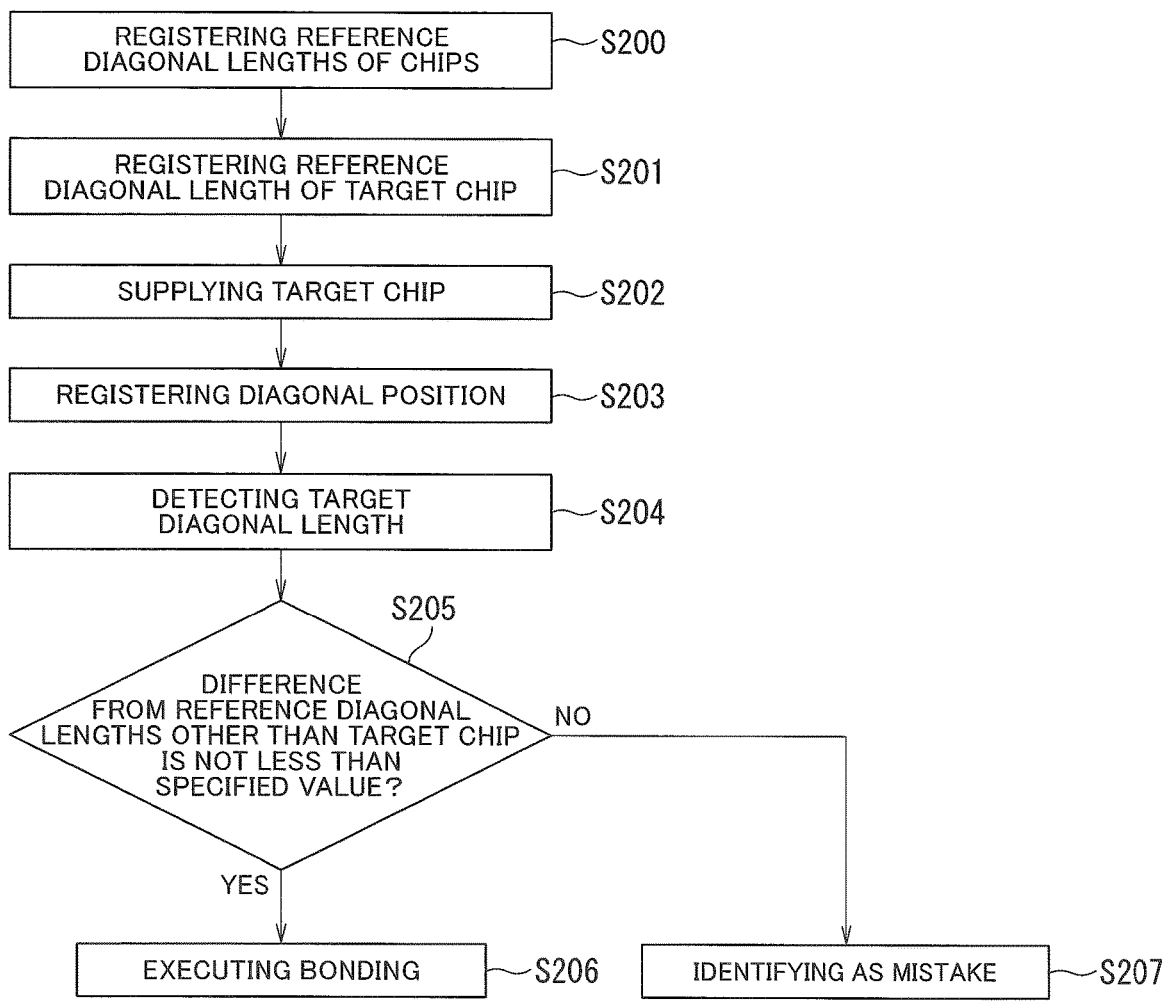
FIG. 8 is a flowchart illustrating a first modification of an identifying method of the semiconductor element according to the embodiment of the present invention.
Figure 9:
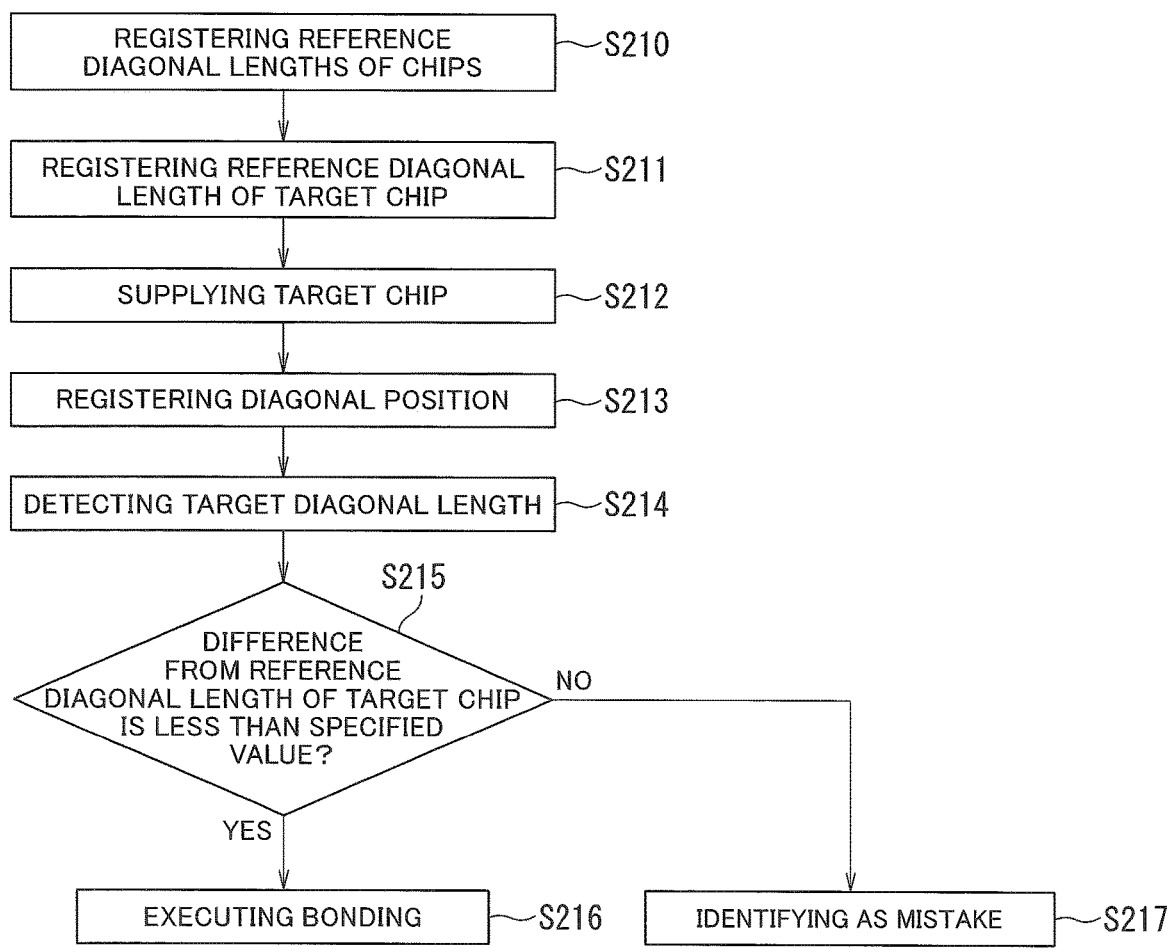
FIG. 9 is a flowchart illustrating second modification of an identifying method of the semiconductor element according to the embodiment of the present invention.

In the first and second modifications of the embodiment, as illustrated in FIGS. 8 and 9, the identification methods of the semiconductor element for three types of semiconductor elements having different characteristics are illustrated as examples. However, the first and second modifications of the embodiment shall be applied to other identification methods, which may include two types of semiconductor elements or four or more types of semiconductor elements.

Other Embodiments

While the present invention has been described above by reference to the embodiment and the modifications, it should be understood that the present invention is not intended to be limited to the descriptions of the specification and the drawings implementing part of this disclosure. Various alternative embodiments, examples, and technical applications will be apparent to those skilled in the art according to this disclosure.

Figure 10:
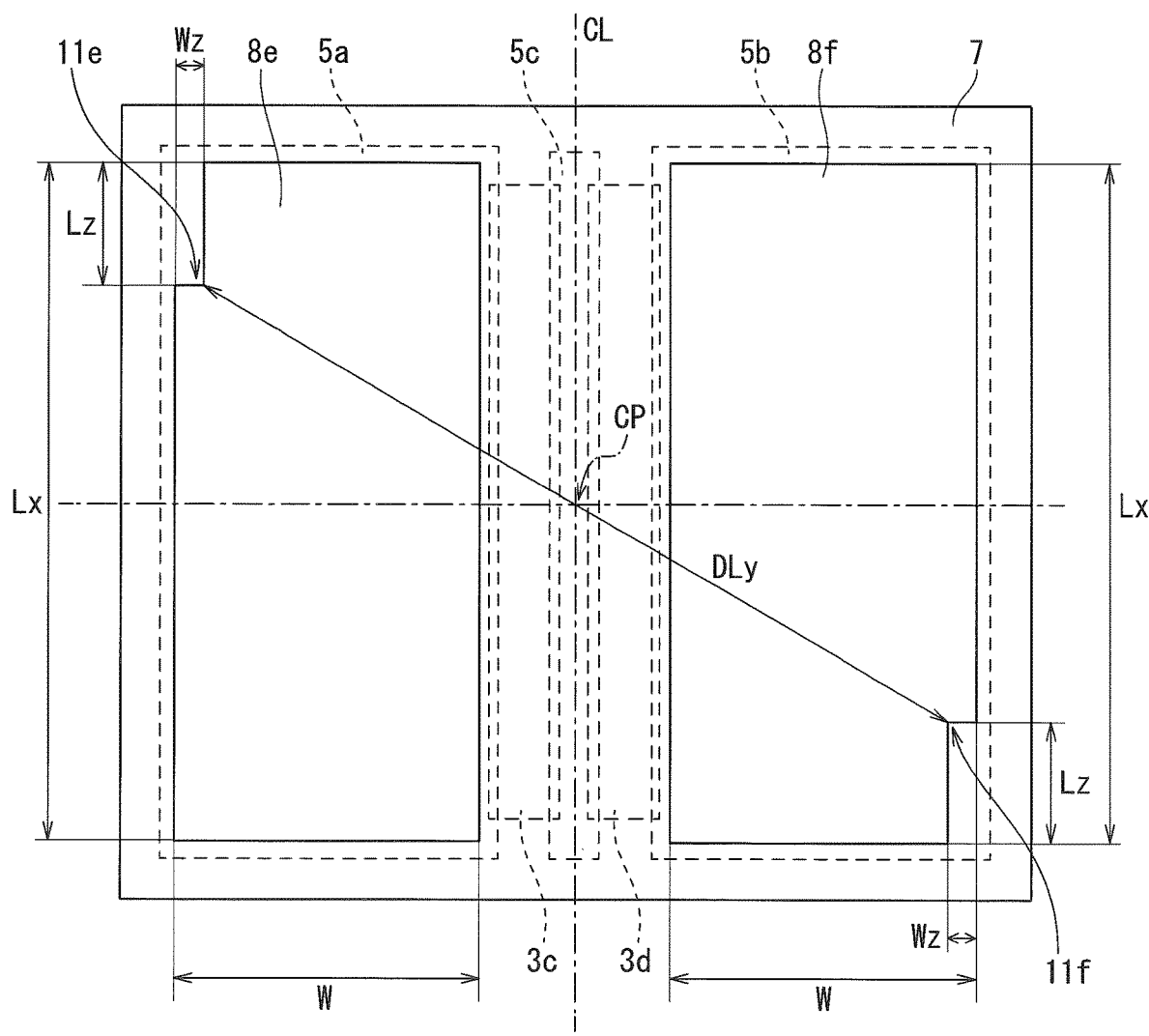
FIG. 10 is a plan view illustrating an example of a semiconductor element according to other embodiments of the present invention.

In the embodiment, the case where the new semiconductor element is introduced into the factory assembly-line for the earlier semiconductor element has been exemplified. However, a plurality of types of semiconductor elements having the same chip size and different resistance values may be introduced into the factory assembly-line. In the embodiment, as illustrated in FIG. 1, only the length L of the long side of each of the rectangular first window 8a and the rectangular second window 8b is shortened by the decremented length R, so that the diagonal length DL shorter than the diagonal length DLx of the is achieved. However, since the effective connection areas 10a, 10b illustrated in FIG. 1 are required for the lengths L of the windows, there is a limit to shortening the length L of each long side of the windows. In such a case, a semiconductor element according to other embodiment of the present invention as illustrated in FIG. 10 may be adopted. For example, as illustrated in FIG. 10, as a planar pattern, a concave portion directed inward in a first window 8e, in which a first intersection point 11e can be assigned, having a length Lz in the long side direction and a width Wz in the short side direction is provided at an upper left corner of the first window 8e. Similarly, as a planar pattern, a concave portion directed inward in a second window 8f, in which a second intersection point 11f can be assigned, having a length Lz in a long side direction and a width Wz in a short side direction is provided at a lower right corner of the second window 8f. A distance between the first and second intersections 11e, 11f is defined as a diagonal length DLy. The diagonal length DLx of the semiconductor element illustrated in FIG. 5 is about 3.08 millimeters, and the diagonal length DL of the semiconductor element illustrated in FIG. 1 is about 2.96 millimeters. In addition, the diagonal length DLy of the semiconductor element illustrated in FIG. 10 is 2.29 millimeters. Thus, the semiconductor element according to the other embodiment can be identified for the semiconductor element described above.

Figure 11:
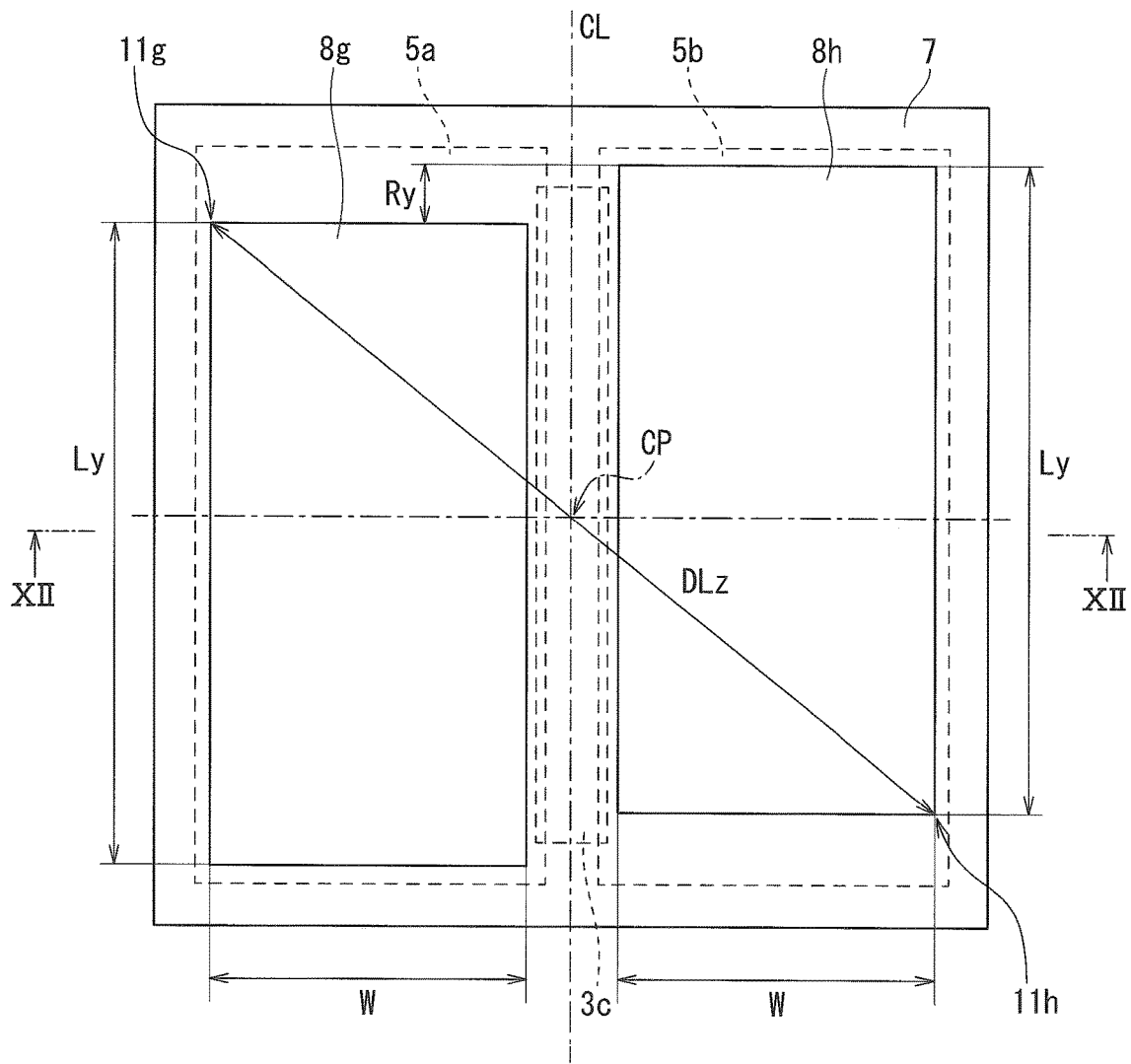
FIG. 11 is a plan view illustrating another example of a semiconductor element according to the other embodiments of the present invention.
Figure 12:
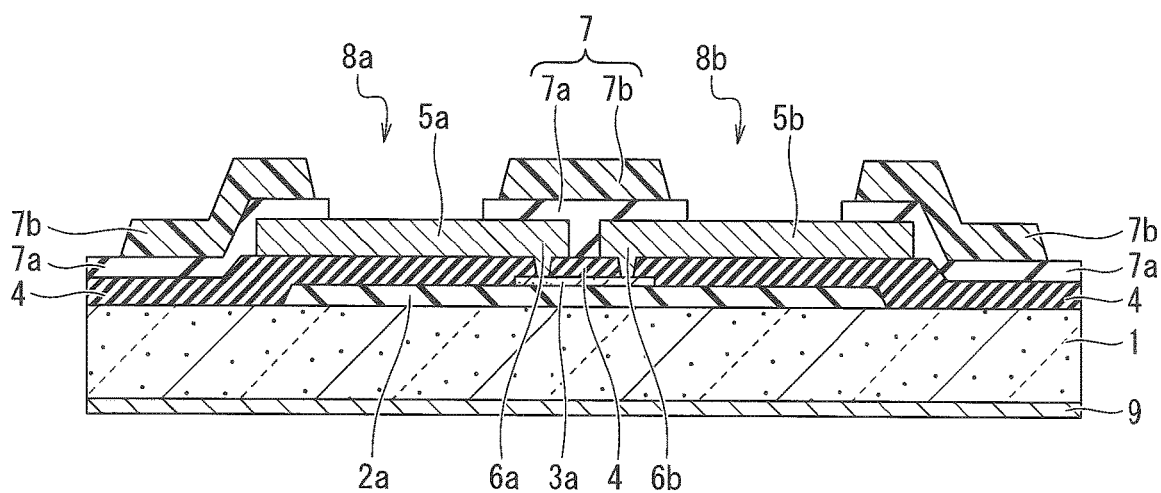
FIG. 12 is a schematic cross-sectional view of the semiconductor element taken along the line XII-XII of FIG. 11.

Further, as the semiconductor element of the embodiment, as illustrated in FIG. 1 and FIG. 2, the resistance element having the vertical structure connected to the semiconductor substrate 1 via the intermediate connecter 5c is illustrated. However, a horizontal structure in which the intermediate connecter 5c is omitted may be used. For example, as illustrated in FIGS. 11 and 12, only a length Ly of each long side of a rectangular first window 8g and a second window 8h is shortened by a decremented length Ry, so that a horizontal structure having a diagonal length DLz shorter than the diagonal length DLx of the earlier semiconductor element is achieved. As illustrated in the cross-sectional view of FIG. 12, in a horizontal resistance element has a structure, the intermediate connecter 5c may be omitted, and the underlying-insulating film 2b and the second resistive layer 3b as illustrated in FIG. 2 may also be omitted. In the case of the horizontal structure, the counter electrode 9 can be omitted when the back surface of the semiconductor substrate 1 is mounted on a circuit board or the like with an adhesive or the like.

From the above disclosure, various alternative embodiments, examples and operational techniques will be apparent to those skilled in the art. As described above, it should be noted that the present invention includes various embodiments which are not disclosed herein. Therefore, the scope of the present invention is defined only by the technical features specifying the present invention, which are prescribed by claims, the words and terms in the claims shall be reasonably construed from the subject matters recited in the present Specification.

What is claimed is:

1. A semiconductor element comprising:
   a first external electrode provided on an upper surface side of a semiconductor chip;
   a second external electrode, spaced apart from the first external electrode, provided in parallel with the first external electrode; and
   a protective film covering the first and second external electrodes, having first and second windows to expose portions of upper surfaces of the first and second external electrodes, respectively,
      wherein
         portions of the first and second external electrodes exposed from the first and second window serve as mounting pad areas, and
         planar patterns of the first and second windows are in two-fold rotational symmetry with respect to a center point of an area including the first and second external electrodes and to be asymmetric with respect to a center line between the first and second external electrodes.

2. The semiconductor element of claim 1, wherein the first and second windows have rectangular shapes, respectively, and positions of sides of the first and second windows are different in the longer side direction of the first and second windows.

3. The semiconductor element of claim 1, wherein a concave portion directed inward is provided at a corner portion of each planar pattern of the first and second windows.

4. The semiconductor element of claim 1, further comprising:
   a semiconductor substrate which implements a part of the semiconductor chip;
   an underlying-insulating film provided on the semiconductor substrate;
   a first resistive layer provided on the underlying-insulating film;
   a second resistive layer provided on the underlying-insulating film, spaced apart from the first resistive layer, and in parallel to the first resistive layer;
   an interlayer insulating film covering the first and second resistive layers;
   an intermediate connecter electrically connected to each of the first and second resistive layers and ohmically connected to the semiconductor substrate; and
   a counter electrode provided under the semiconductor substrate, wherein
      the first external electrode is disposed on the interlayer insulating film to be electrically connected to the first resistive layer, and
      the second external electrode is disposed on the interlayer insulating film to be electrically connected to the second resistive layer.

5. A method for identifying a semiconductor element, comprising:
   registering data of a distance between a first reference intersection and a second reference intersection as a reference diagonal length by capturing a planar image of a reference semiconductor element, the reference semiconductor element including:
      a first reference external electrode provided on an upper surface of a reference chip;
      a second reference external electrode having a similar shape with the first reference external electrode, spaced apart from the first reference external electrode and provided in parallel to the first reference external electrode on the upper surface of the reference chip; and
      a reference protective film having first and second reference windows, which cover the upper surface of the reference chip, each having a rectangular shape, the first and second reference windows expose parts of the first and second reference external electrodes, respectively, the first and second reference windows are in symmetry with respect to a center line between the first and second reference external electrodes, wherein
         in planar patterns of the first and second reference windows, the first and second reference intersections are located opposite sides of the first and second windows facing each other, and in two-fold rotational symmetry with respect to a center point of an area including the first and second reference external electrodes;
   registering data of a distance between first and second intersection points as a target diagonal length by capturing a planar image of a target semiconductor element, the target semiconductor element including:

a first external electrode provided on an upper surface of a target chip;

a second external electrode having a similar shape with the first external electrode, spaced apart from the first external electrode and provided in parallel to the first external electrode on the upper surface of the target chip; and a protective film having first and second windows, which cover the upper surface of the target chip, each having a rectangular shape, the first and second windows expose parts of the first and second external electrodes, respectively, wherein in planar patterns of the first and second windows, the first and second windows are in point-symmetry with respect to a center point of an area including the first and second external electrodes and asymmetric with respect to a center line between the first and second external electrodes, and each of the first and second intersection points is defined at a position where each long side located an opposite side of the first and second windows facing each other, crosses each short side; and identifying the target chip as an appropriate product when a diagonal length difference between the reference diagonal length and the target diagonal length is equal to or greater than a specified value.

6. A method for identifying a plurality of semiconductor elements having different characteristics, the semiconductor elements each having a different diagonal length, which is a distance between first and second intersection points, each of the semiconductor elements including:

a first external electrode provided on an upper surface of each of the semiconductor elements;

a second external electrode having a similar shape with the first external electrode, spaced apart from the first external electrode and provided in parallel to the first external electrode on the upper surface of each of the semiconductor elements; and a protective film having first and second windows, which cover the upper surface of each of the semiconductor elements, each of the first and second windows having a rectangular shape, exposes a part of the first and second external electrodes, respectively, wherein in planar patterns of the first and second windows, the first and second intersection points are located opposite sides of the first and second windows facing each other, and in two-fold rotational symmetry with respect to a center point of an area including the first and second external electrodes, the method comprising:

registering data of the diagonal length for each of the semiconductor elements as a reference diagonal length by capturing a planar image for each of the semiconductor elements;

registering data of one of the semiconductor elements as a target semiconductor element;

supplying a new semiconductor chip of the target semiconductor element;

registering data of a diagonal length of the new semiconductor chip as a target diagonal length by capturing a planar image of the new semiconductor chip; and identifying the new semiconductor chip as an appropriate product when a diagonal length difference between the reference diagonal length of each of the semiconductor elements and the target diagonal length are equal to or greater than a specified value.

7. A method for identifying a plurality of semiconductor elements having different characteristics, the semiconductor elements each having a different diagonal length, which is a distance between first and second intersection points, each of the semiconductor elements including:

a first external electrode provided on an upper surface of each of the semiconductor elements;

a second external electrode having a similar shape with the first external electrode, spaced apart from the first external electrode and provided in parallel to the first external electrode on the upper surface of each of the semiconductor elements; and a protective film having first and second windows, which cover the upper surface of each of the semiconductor elements, each of the first and second windows having a rectangular shape, exposes a part of the first and second external electrodes, respectively, wherein in planar patterns of the first and second windows, the first and second intersection points are located opposite sides of the first and second windows facing each other, and in two-fold rotational symmetry with respect to a center point of an area including the first and second external electrodes, the method comprising:

registering data of the diagonal length for each of the semiconductor elements as a reference diagonal length by capturing a planar image for each of the semiconductor elements;

registering data of one of the semiconductor elements as a target semiconductor element;

supplying a new semiconductor chip of the target semiconductor element;

registering data of a diagonal length of the new semiconductor chip as a target diagonal length by capturing a planar image of the new semiconductor chip; and identifying the new semiconductor chip as an appropriate product when a diagonal length difference between the reference diagonal length of the target semiconductor element and the target diagonal length is less than a specified value.

8. The method of claim 5, wherein the first and second windows have rectangular shapes, and positions of sides of the first and second windows are different in a longer side direction of the first and second windows.

9. The method of claim 5, wherein each of the first and second intersection points is provided at a position where a concave portion directed inward is provided at a corner portion of each planar pattern of the first and second windows.

10. The method of claim 5, wherein the specified value is 50 micrometers.

11. The semiconductor element of claim 1, further comprising:

a semiconductor substrate which implements a part of the semiconductor chip;

an underlying-insulating film provided on the semiconductor substrate;

a first resistive layer provided on the underlying-insulating film; and an interlayer insulating film covering the first resistive layer, wherein the first external electrode is disposed on the interlayer insulating film to be electrically connected to the first resistive layer, and the second external electrode is disposed on the interlayer insulating film to be electrically connected to the first resistive layer at a position spaced apart from a connected position between the first external electrode and the first resistive layer.

\* \* \* \* \*

UNITED STATES PATENT AND TRADEMARK OFFICE
CERTIFICATE OF CORRECTION

| | | |
|---|---|---|
| PATENT NO. | : 11,408,925 B2 | Page 1 of 1 |
| APPLICATION NO. | : 16/660205 | |
| DATED | : August 9, 2022 | |
| INVENTOR(S) | : Taichi Karino | |

It is certified that error appears in the above-identified patent and that said Letters Patent is hereby corrected as shown below:

On the Title Page

Item (71) Column 1, Line 2, delete "Kawaskai" and insert --Kawasaki--.

Signed and Sealed this
Twentieth Day of September, 2022

*Katherine Kelly Vidal*

Katherine Kelly Vidal
*Director of the United States Patent and Trademark Office*